(12) United States Patent
Nagaoka et al.

(10) Patent No.: US 11,534,791 B2
(45) Date of Patent: Dec. 27, 2022

(54) MIST GENERATOR, FILM FORMATION APPARATUS, AND METHOD OF FORMING FILM USING THE FILM FORMATION APPARATUS

(71) Applicants: Tatsuji Nagaoka, Nagakute (JP); Hiroyuki Nishinaka, Kyoto (JP); Masahiro Yoshimoto, Kyoto (JP)

(72) Inventors: Tatsuji Nagaoka, Nagakute (JP); Hiroyuki Nishinaka, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

(*) Notice: Subject to any disclaimer, the term of this patent is extended or adjusted under 35 U.S.C. 154(b) by 83 days.

(21) Appl. No.: 15/931,968

(22) Filed: May 14, 2020

(65) Prior Publication Data
US 2020/0376515 A1 Dec. 3, 2020

(30) Foreign Application Priority Data
Jun. 3, 2019 (JP) .............................. JP2019-103748

(51) Int. Cl.
| | | |
|---|---|---|
| B05B 17/06 | (2006.01) | |
| B05B 7/00 | (2006.01) | |
| H01L 21/02 | (2006.01) | |

(52) U.S. Cl.
CPC ........ B05B 17/0615 (2013.01); B05B 7/0012 (2013.01); H01L 21/02628 (2013.01)

(58) Field of Classification Search
CPC .............. B05B 17/0615; B05B 7/0012; H01L 21/02628

(Continued)

(56) References Cited

U.S. PATENT DOCUMENTS

| | | | | |
|---|---|---|---|---|
| 6,127,429 A | * | 10/2000 | Katusic | ................. B01F 3/0407 |
| | | | | 118/303 |
| 7,721,729 B2 | * | 5/2010 | Von Hollen | ......... A61M 11/002 |
| | | | | 128/200.14 |

(Continued)

FOREIGN PATENT DOCUMENTS

| | | |
|---|---|---|
| JP | 2011-110453 A | 6/2011 |
| JP | 2016-079485 A | 5/2016 |

(Continued)

OTHER PUBLICATIONS

U.S. Appl. No. 16/741,060, filed Jan. 13, 2020.
Office Action dated Apr. 13, 2021 in U.S. Appl. No. 16/741,060.

*Primary Examiner* — Chee-Chong Lee
(74) *Attorney, Agent, or Firm* — Sughrue Mion, PLLC

(57) ABSTRACT

A mist generator may include a reservoir storing a solution, a plurality of ultrasonic vibrators, a mist delivery path, and a mist collector. The plurality of ultrasonic vibrators may be disposed under the reservoir and configured to apply ultrasonic vibration to the solution stored in the reservoir to generate mist of the solution in the reservoir. The mist delivery path may be configured to deliver the mist from an inside of the reservoir to an outside of the reservoir. The mist collector may be disposed above the solution in the reservoir, wherein an upper end of the mist collector may be connected to an upstream end of the mist delivery path, a lower end of the mist collector may include an opening, and a width of the mist collector may increase from the upper end toward the opening. The plurality of ultrasonic vibrators may be located directly under the opening.

7 Claims, 4 Drawing Sheets

(58) Field of Classification Search
USPC .................................................. 239/102.2
See application file for complete search history.

(56) References Cited

U.S. PATENT DOCUMENTS

| | | | |
|---|---|---|---|
| 2005/0218241 A1* | 10/2005 | Matsuura | B01D 5/0081 |
| | | | 239/8 |
| 2008/0223953 A1* | 9/2008 | Tomono | F24F 6/12 |
| | | | 239/102.2 |
| 2008/0245362 A1* | 10/2008 | Moessis | B05B 17/0615 |
| | | | 128/200.16 |
| 2016/0158788 A1 | 6/2016 | Orita et al. | |
| 2018/0066361 A1 | 3/2018 | Nara et al. | |
| 2018/0371613 A1 | 12/2018 | Nagaoka | |

FOREIGN PATENT DOCUMENTS

| | | |
|---|---|---|
| KR | 10-2016-0029839 A | 3/2016 |
| WO | 2015/019468 A1 | 2/2015 |
| WO | 2016/133131 A1 | 8/2016 |
| WO | 2017/154937 A1 | 9/2017 |

\* cited by examiner

MIST GENERATOR, FILM FORMATION APPARATUS, AND METHOD OF FORMING FILM USING THE FILM FORMATION APPARATUS

CROSS-REFERENCE TO RELATED APPLICATION

This application claims priority to Japanese Patent Application No. 2019-103748, on Jun. 3, 2019, the entire contents of which are incorporated herein by reference.

TECHNICAL FIELD

The disclosure herewith relates to a mist generator, a film formation apparatus, and a method of forming a film using the film formation apparatus.

BACKGROUND

A mist generator in Japanese Patent Application Publication No. 2016-079485 includes a reservoir storing a solution, and an ultrasonic vibrator disposed under the reservoir. The ultrasonic vibrator is configured to apply ultrasonic vibration to the solution stored in the reservoir to generate mist of the solution in the reservoir. The atomized solution is supplied to an outside of the mist generator through a mist delivery path connected to the reservoir.

SUMMARY

Once mist is generated in the reservoir, the mist firstly flowing into the mist delivery path, which is connected to the reservoir, is firstly supplied to the outside. The mist generated in the reservoir circulates in the reservoir, so efficient supply of the mist to the outside is difficult. The present disclosure provides a technology that enables efficient supply of mist to an outside.

A mist generator disclosed herein may comprise a reservoir, a plurality of ultrasonic vibrators, a mist delivery path, and a mist collector. The reservoir may store a solutions. The plurality of ultrasonic vibrators may be disposed under the reservoir and configured to apply ultrasonic vibration to the solution stored in the reservoir to generate mist of the solution in the reservoir. The mist delivery path may be configured to deliver the mist from an inside of the reservoir to an outside of the reservoir. The mist collector may be disposed above the solution in the reservoir, an upper end of the mist collector may be connected to an upstream end of the mist delivery path, a lower end of the mist collector may include an opening, and a width of the mist collector may increase from the upper end toward the opening. The plurality of ultrasonic vibrators may be located directly under the opening.

In the above-described mist generator, the mist collector connected to the mist delivery path is disposed within the reservoir, and the plurality of ultrasonic vibrators is located directly under the opening of the mist collector. Therefore, the mist of the solution, which is generated by the ultrasonic vibration from each of the plurality of ultrasonic vibrators, easily flows into the opening of the mist collector. The width of the mist collector increases from the upper end toward the opening (i.e., the lower end) (i.e., the width decreases from the lower end toward die upper end). Therefore, the mist that has flowed from the opening into the mist collector is suitably guided to the mist delivery path. As such, the mist can be efficiently supplied to the outside.

DETAILED DESCRIPTION

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved mist generators and film formation apparatuses, as well as methods for forming a film using the film formation apparatuses.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or irate mediate entity for the purpose of original written disclosure, as well as for the purpose of restricting the claimed subject matter.

First Embodiment

Figure 1:
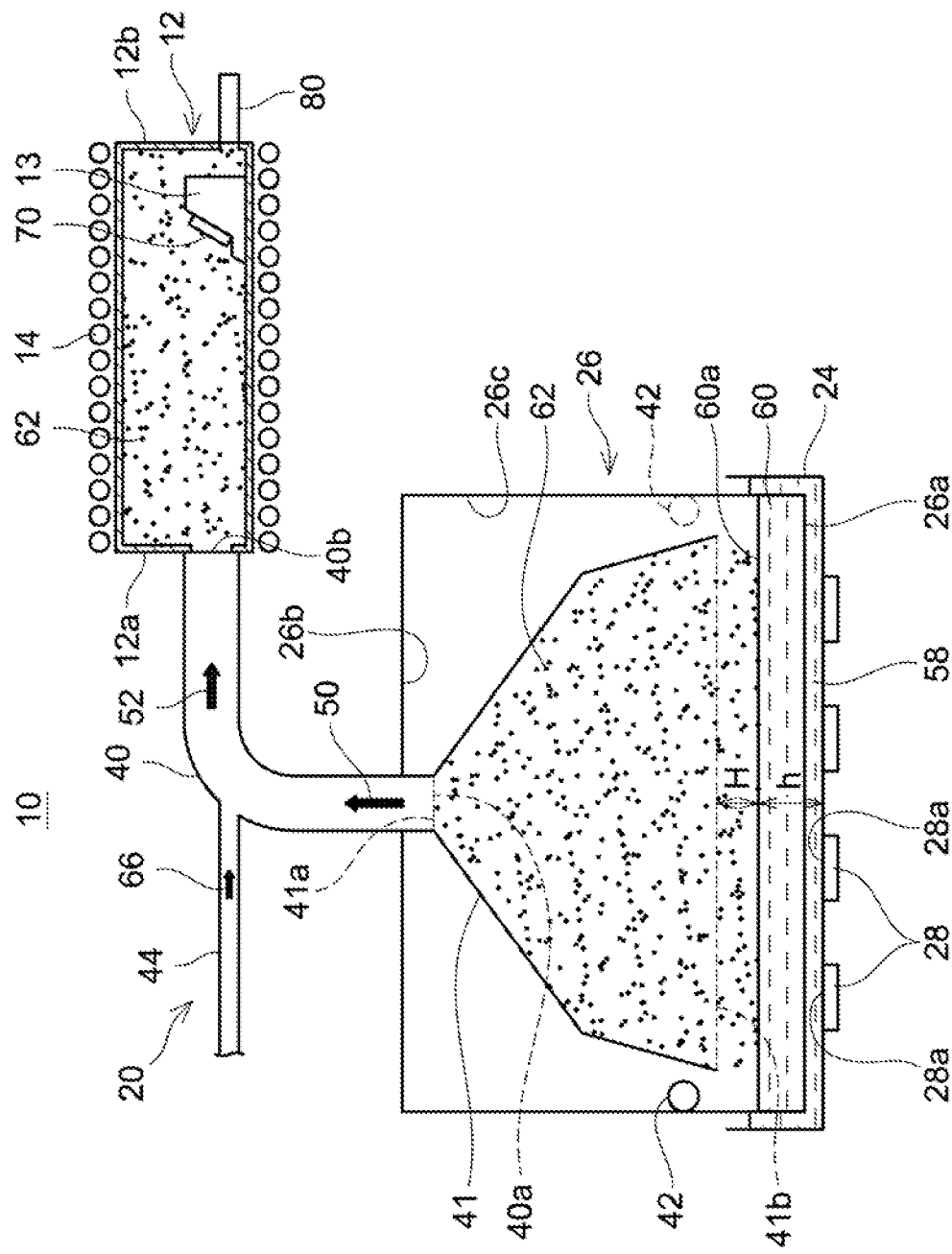
FIG. 1 is a diagram of configuration of a film formation apparatus according to a first embodiment.

A film formation apparatus 10 shown in FIG. 1 is an apparatus configured to epi axially grow a film on a surface of a substrate 70. The film formation apparatus 10 includes a furnace 12 in which the substrate 70 is disposed, a heater 14 configured to heat the furnace 12, a mist generator 20 connected to the furnace 12, and an exhaust pipe 80 connected to the furnace 12.

The specific configuration of the furnace 12 is not particularly limited. As an example, the furnace 12 shown in FIG. 1 is a tubular furnace extending from an upstream end 12a to a downstream end 12b. A cross section of the furnace 12 perpendicular to its longitudinal direction has a circular shape. The cross section of the furnace 12 is not limited to the circular shape.

The mist generator 20 is connected to the upstream end 12a of the furnace 12, The downstream end 12b of the furnace 12 has the exhaust pipe 80 connected thereto. The mist generator 20 is configured to supply mist 62 into the furnace 12. The mist 62 supplied into the furnace 12 by the mist generator 20 flows in the furnace 12 to the downstream end 121, and is then discharged to an outside of the furnace 12 via the exhaust pipe 80.

In the furnace 12, a substrate stage 13 for supporting the substrate 70 is disposed. The substrate stage 13 is configured to incline the substrate 70 with respect to the longitudinal direction of the furnace 12. The substrate 70 is supported by the substrate stage 13 in an orientation that allows the mist 62 flowing in the furnace 12 from the upstream end 12a toward the downstream end 12b to be applied to the surface of the substrate 70.

As described above, the heater 14 is configured to heat the furnace 12. The specific configuration of the beater 14 is not particularly limited. As an example, the heater 14 shown in FIG. 1 is an electric heater, and is disposed along an outer peripheral wall of the furnace 12. The heater 14 heats the outer peripheral wall of the furnace 12, by which the substrate 70 in the furnace 12 is heated.

Figure 2:
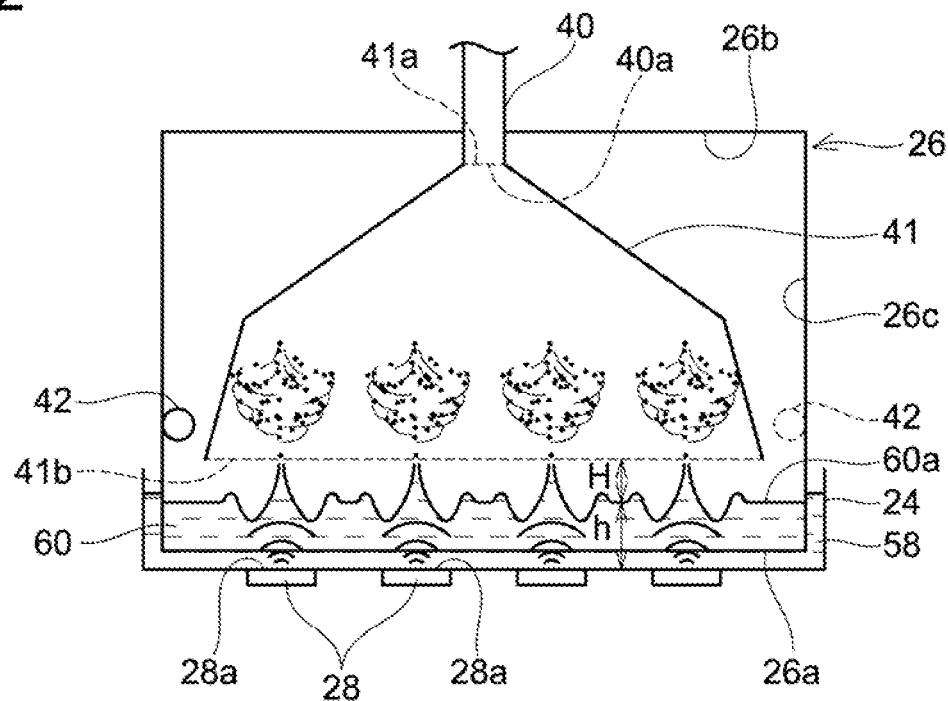
FIG. 2 is a cross-sectioned view of a mist generator while the mist generator is generating mist of a solution (fast embodiment).

As shown in FIGS. 1 and 2, the mist generator 20 includes a water tank 24, a reservoir 26, and a plurality of ultrasonic vibrators 28. The water tank 24 is a container of which upper portion is opened, and stores water 58 therein. Each of the plurality of ultrasonic vibrators 28 is disposed on a bottom surface of the water tank 24. Vibration surfaces 28a of the ultrasonic vibrators 28 are each in contact with the bottom surface of the water tank 24. The ultrasonic vibrators 28 emit ultrasound from their vibration surfaces 28a and apply ultrasonic vibration to the water 58 in the water tank 24. The reservoir 26 is a closed container. The reservoir 26 stores a solution 60 that contains a raw material of a film to be epitaxially grown on the surface of the substrate 70. For example, if a gallium oxide ($Ga_2O_3$) film is to be epitaxially grown, a solution in which gallium is dissolved can be used as the solution 60. Moreover, a raw material for imparting an n-type or p-type dopant to the gallium oxide film (e.g., ammonium fluoride) may further be dissolved in the solution 60. An outer peripheral wall of the reservoir 26 has a cylindrical shape. The reservoir 26 has its bottom portion immersed in the water 58 in the water tank 24. A bottom surface 26a of the reservoir 26 is configured with a film. This facilitates transfer of the ultrasonic vibration from the water 58 in the water tank 24 to the solution 60 in the reservoir 26. When each ultrasonic vibrator 28 applies ultrasonic vibration to the water 58 in the water tank 24, the ultrasonic vibration is transferred to the solution 60 via the water 58. When this happens, a liquid surface 60a of the solution 60 vibrates as shown in FIG. 2, and the mist 62 of the solution 60 is thereby generated in a space above the solution 60 (i.e., a space in the reservoir 26).

The mist generator 20 farther includes a mist delivery path 40, a mist collector 41, two carrier gas supply paths 42, and a diluent gas supply path 44.

As shown in FIGS. 1 and 2, the mist delivery path 40 has its upstream side connected to an upper surface (i.e., a top plate) 26b of the reservoir 26. The mist delivery path 40 penetrates a central portion of the upper surface 26b of the reservoir 26 and extends into the reservoir 26. Therefore, an upstream end 40a of the mist delivery path 40 is located inside the reservoir 26. A downstream end 40b of the mist delivery path 40 is connected to the upstream end 12a of the furnace 12. The mist delivery path 40 is configured to supply the mist 62 from the reservoir 26 to the furnace 12.

Figure 3:
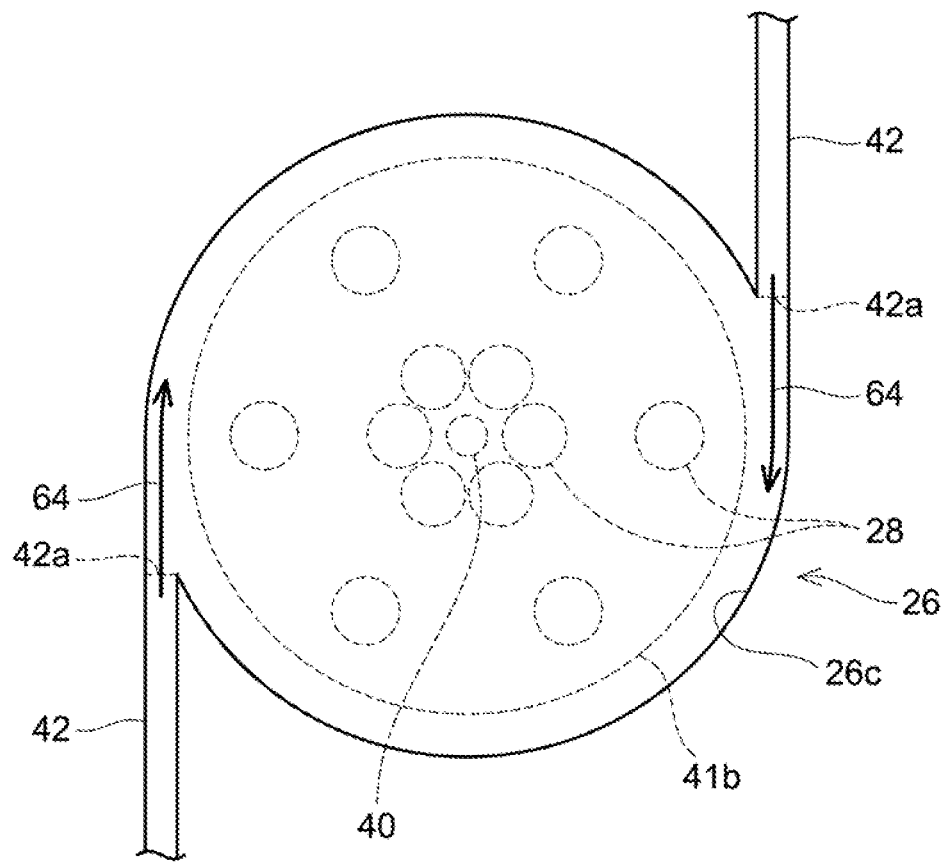
FIG. 3 is a plan view of the mist generator while the mist generator is generating the mist of the solution (first embodiment).

The mist collector 41 is disposed within the reservoir 26. The mist collector 41 is disposed above the solution 60 stored in the reservoir 26. An upper end 41a of the mist collector 41 is connected to the upstream end 40a of the mist delivery path 40. A lower end of the mist collector 41 includes an opening 41b. An entirety of the lower end of the mist collector 41 serves as the opening 41b. The mist collector 41 is shaped to have a width that increases from the upper end 41a toward the opening 41b. In the present embodiment, the mist collector 41 has a circular cross section. In other words, the mist collector 41 is a tubular member that has a diameter increasing from the upper end 41a toward the opening 41b. The cross section of the mist collector 41 is not limited to the circular one, and it may be in any shape as long as the width of the mist collector 41 increases from the upper end 41a toward the opening 41b. As shown in FIG. 3, in a plan view of the reservoir 26 from above, the plurality of ultrasonic vibrators 28 is located within the opening 41b. In other words, each of the plurality of ultrasonic vibrators 28 is located directly under the opening 41b.

The carrier gas supply paths 42 has their upstream ends connected to a carrier gas supply source (not shown). As shown in FIG. 3, the carrier gas supply paths 42 are configured to supply carrier gas 64 from the carrier gas supply source to the reservoir 26. The carrier gas 64 is nitrogen gas or another inert gas. The carrier gas 64 is discharged from downstream ends (i.e., discharge ports 42a) of the carrier gas supply paths 42 into the reservoir 26. The discharge ports 42a of the carrier gas supply paths 42 are connected to a lateral wall of the reservoir 26. The discharge ports 42a of the carrier gas supply paths 42 are located on a peripheral side of the reservoir 26 relative to the opening 41b of the mist collector 41. As shown in FIG. 3, each carrier gas supply path 42 extends from an inner lateral surface 26c of the reservoir 26 along its tangential direction. Therefore, each carrier gas supply path 42 discharges the carrier gas 64 along the inner lateral surface 26c of the reservoir 26. The carrier gas 64 discharged into the reservoir 26 flows along the inner lateral surface 26c of the reservoir 26 in a circumferential direction of the reservoir 26 (in a clockwise direction in FIG. 3). Thereafter, the carrier gas 64 flows into the mist collector 41, and then flows into the mist delivery path 40 from the upstream end 40a of the mist delivery path 40. At this time, the mist 62 in the reservoir 26 flows into the mist delivery path 40 together with the carrier gas 64.

As shown in FIG. 1, the diluent gas supply path 44 has its downstream end connected to the mist delivery path 40 outside of the reservoir 26. The diluent gas supply path 44 has its upstream end connected to a diluent gas supply source (not shown). The diluent gas supply path 44 is configured to supply diluent gas 66 from the diluent gas supply source to the mist delivery path 40. The diluent gas 66 is nitrogen gas or another inert gas. The diluent gas 66 that has flowed into the mist delivery path 40 flows to the furnace 12 together with the mist 62 and the carrier gas 64. The diluent gas 66 dilutes the mist 62 in the mist delivery path 40.

Next, a method of forming a film using the film formation apparatus 10 will be described. Here, a substrate constituted of β-gallium oxide (β-$Ga_2O_3$) single crystal is used as the substrate 70. Moreover, an aqueous solution in which gallium chloride ($GaCl_3$, $Ga_2Cl_6$) and ammonium fluoride ($NH_4F$) are dissolved is used as the solution 60. Moreover, nitrogen gas is used both as the carrier gas 64 and as the diluent gas 66.

Firstly, the reservoir 26 that has stored the solution 60 therein is prepared. Here, the solution 60 is stored in the reservoir 26 such that the following relationship is satisfied. Specifically, as shown in FIGS. 1 and 2, the solution 60 is stored in the reservoir 26 such that a relationship of h≥H is satisfied, where h is a distance from the ultrasonic vibrators 28 to the liquid surface 60a of the solution 60, and H is a distance from the liquid surface 60a to the opening 41b. Although the liquid level of the solution 60 changes while a film is formed, the above-described relationship is maintained until the film formation is completed on the surface of the substrate 70.

Next, the substrate 70 is placed on the substrate stage 13 in the furnace 12. Then, the substrate 70 is heated by the heater 14. Here, a temperature of the substrate 70 is controlled to be approximately 750° C. When the temperature of the substrate 70 becomes stable, the mist generator 20 is activated. In other words, the ultrasonic vibrators 28 are activated to generate mist of the solution 60 in the reservoir 26. Simultaneously, the carrier gas 64 is introduced from the carrier gas supply paths 42 into the reservoir 26 (see FIG. 3), and the diluent gas 66 is introduced from the diluent gas supply path 44 into the mist delivery path 40 (see FIG. 1). Firstly, only a part of the plurality of ultrasonic vibrators 28 is activated. Then, after a predetermined time interval, the remaining (non-activated) ultrasonic vibrator(s) 28 out of the plurality of ultrasonic vibrators 28 is activated. In other words, the present embodiment does not activate all the ultrasonic vibrators 28 simultaneously, but firstly activates a part of the plurality of the ultrasonic vibrators 28, and some time later, activates the remaining ultrasonic vibrator(s) 28. The ultrasonic vibrators 28 may be divided into more than two groups to be activated sequentially. Moreover, which of the ultrasonic vibrators 28 is/are firstly activated is not particularly limited. As shown in FIG. 1, the carrier gas 64 flows through the reservoir 26 and flows into the mist delivery path 40 through the mist collector 41 as shown by an arrow 50. At this time, the mist 62 in the reservoir 26 flows into the mist delivery path 40 together with the carrier gas 64. The diluent gas 66 is mixed with the mist 62 in the mist delivery path 40. The mist 62 is thereby diluted. The mist 62 flows in the mist delivery path 40 toward its downstream side together with the nitrogen gas (i.e., the carrier gas 64 and the diluent gas 66), and then flows into the furnace 12 from the downstream end 40b of the mist delivery path 40, as shown by an arrow 52. In the furnace 12, the mist 62 flows toward the downstream end 12b together with the nitrogen gas, and is then discharged from the exhaust pipe 80.

A part of the mist 62 flowing in the furnace 12 adheres to the surface of the heated substrate 70. When this happens, the mist 62 (i.e., the solution 60) chemically reacts on the substrate 70. Consequently, β-gallium oxide (β-$Ga_2O_3$) is generated on the substrate 70. Since the mist 62 is continuously supplied to the surface of the substrate 70, a β-gallium oxide film is grown on the surface of the substrate 70. A single-crystal β-gallium oxide film is grown on the surface of the substrate 70. Since the solution 60 contains ammonium fluoride, the β-gallium oxide film is doped with fluorine.

To terminate the formation of the gallium oxide film on the surface of the substrate 70, only a part of the plurality of ultrasonic vibrators 28 is firstly stopped. Then, after a predetermined time interval, the remaining (i.e., activating) ultrasonic vibrator(s) 28 is stopped. In other words, the present embodiment does not stop all the ultrasonic vibrators 28 simultaneously, but firstly stops a part of the plurality of the ultrasonic vibrators 28, and some time later, stops the remaining ultrasonic vibrator(s) 28. The ultrasonic vibrators 28 may be divided into more than two groups to be stopped sequentially. Moreover, which of the ultrasonic vibrators 28 is/are firstly stopped is not particularly limited.

In the film formation apparatus 10 of the present embodiment, the mist collector 41 connected to the mist delivery path 40 is disposed within the reservoir 26, and the plurality of ultrasonic vibrators 28 is located directly under the opening 41b of the mist collector 41. Therefore, the mist 62 of the solution 60, which is generated by the ultrasonic vibration from each of the plurality of ultrasonic vibrators 28 easily flows into the opening 41b of the mist collector 41. The width of the mist collector 41 increases from the upper end 41a toward the opening 41b (i.e., the width decreases from the opening 41b toward the upper end 41a), Therefore, the mist 62 that has flowed into the mist collector 41 from the opening 41b is suitably guided to the mist delivery path 40. Thus, the mist 62 can be efficiently supplied to the furnace 12.

Moreover, in the film formation apparatus 10 of the present embodiment, the discharge ports 42a of the carrier gas supply paths 42 are located on the peripheral side of the reservoir 26 relative to the opening 41b. Disposing the discharge ports 42a of the carrier gas supply paths 42 on the peripheral side relative to the opening 41b of the mist collector 41 (i.e., closer to the inner lateral surface 26c of the reservoir 26) can suppress the generated mist 62 from, being disturbed by the carrier gas 64. In other words, changes in concentration of the mist 62 to be supplied from the reservoir 26 to the outside can be suppressed.

Moreover, in the film formation apparatus 10 of the present embodiment, the carrier gas supply paths 42 are disposed so as to discharge the carrier gas 64 along the inner lateral surface 26c of the reservoir 26. The carrier gas 64 discharged as such flows vertically along the inner lateral surface 26c of the reservoir 26, and flows from the peripheral side of the reservoir 26 toward a central portion thereof. The generated mist 62 can therefore be guided suitably into the mist collector 41.

Moreover, in the film formation apparatus 10 of the present embodiment, the relationship of h≥H is established between the distance h from the ultrasonic vibrators 28 to the liquid surface 60a of the solution 60 and the distance H from the liquid surface 60a to the opening 41b. The mist 62, which is generated by the ultrasonic vibration in the solution 60, becomes stable at a certain height from the liquid surface 60a of the solution 60. Specifically, as shown in FIG. 2, the mist 62 becomes stable at a height that is above the liquid surface 60a by a distance approximately equal to the distance h from the vibration surfaces 28a of the ultrasonic vibrators 28 to the liquid surface 60a of the solution 60 (i.e., at a height that is approximately distance h apart from the liquid surface 60a). In the present embodiment, the opening 41b is disposed below the height at which the mist 62 becomes stable. The film formation apparatus 10 of the present embodiment therefore suitably enables the generated mist 62 to flow into the mist collector 41.

The short distance H increases the flow velocity of the curler gas 64 when the carrier gas 64 flows into the mist collector 41 through a spacing of the distance H (i.e., a spacing between the lower end of the mist collector 41 and the solution 60). The generated mist 62 therefore can easily gather into the mist collector 41, and thus the mist 62 can be introduced more efficiently into the mist delivery path 40.

Moreover, in the present embodiment, when a film is to be grown on the surface of the substrate 70, a part of the plurality of ultrasonic vibrators 28 is firstly activated, and after a predetermined time interval, the remaining ultrasonic vibrator(s) 28 is activated. Starting the activation of the ultrasonic vibrators 28 at plural different timings as such can gently increase the rate of film formation. Therefore, a film having stable characteristics can be grown at the start of the film formation.

Moreover, in the present embodiment when the growth of the film on the surface of the substrate 70 is to be terminated, a part of the plurality of ultrasonic vibrators 28 is firstly stopped, and after a predetermined time interval, the remaining ultrasonic vibrator(s) 28 is stopped. Stopping the activation of the ultrasonic vibrators 28 at plural different timings as such can gently decrease the rate of film formation. Therefore, characteristics of the grown film can be stabilized at the termination of the film formation.

Second Embodiment

Figure 4:
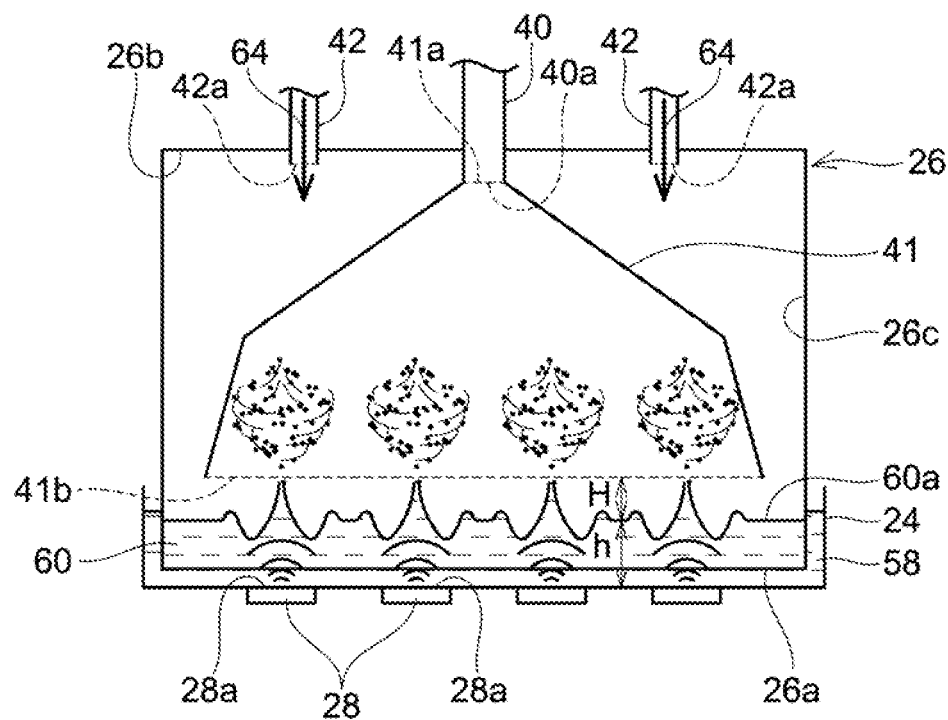
FIG. 4 is a cross-sectional view of a mist generator while the mist generator is generating mist of a solution (second embodiment).
Figure 5:
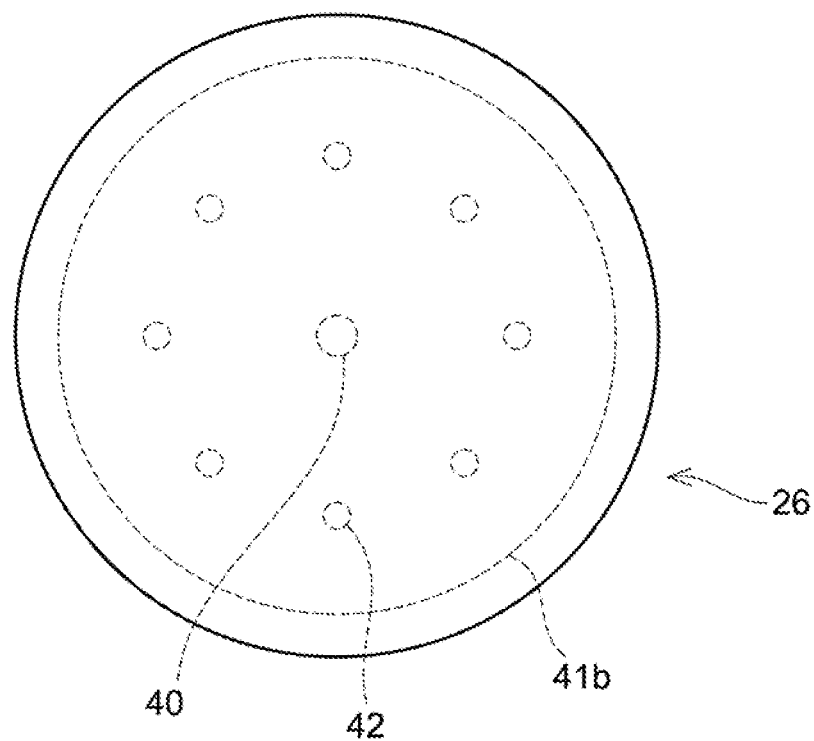
FIG. 5 is a plan view of the mist generator while the mist generator is generating the mist of the solution (second embodiment).

A film formation apparatus of a second embodiment differs from the film formation apparatus 10 of the first embodiment in the configuration of the mist generator 20. As shown in FIG. 4, in the mist generator of the second embodiment, the plurality of carrier gas supply paths 42 is connected to the upper surface 26b of the reservoir 26. As shown in FIG. 5, in the plan view of the reservoir the carrier gas supply paths 42 are disposed to surround the mist delivery path 40. In the present embodiment, eight carrier gas supply paths 42 are disposed around the mist delivery path 40. Each of the carrier gas supply paths 42 extend s into the reservoir 26. The discharge port 42a of each carrier gas supply path 42 is located above the opening 41b of the mist collector 41. The other configurations of the film formation apparatus of the second embodiment are the same as those of the film formation apparatus 10 of the first embodiment.

In the film formation apparatus of the second embodiment 2, the carrier gas supply paths 42 are connected to the upper surface 26b of the reservoir 26, unlike the first embodiment. Such a configuration can also suppress the generated mist 62 from being disturbed by the carrier gas 64 discharged from the carrier gas supply paths 42.

Third Embodiment

Figure 6:
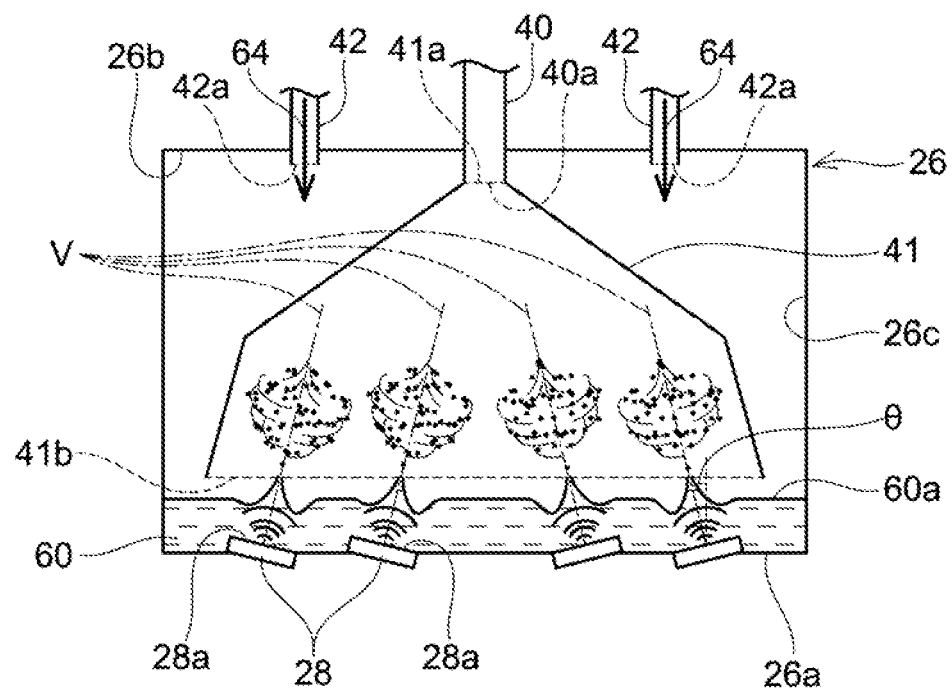
FIG. 6 is a cross-sectional view of a mist generator while the mist generator is generating mist of a solution (third embodiment).

A film formation apparatus of a third embodiment differs from the film formation apparatus of the second embodiment in the arrangement of the ultrasonic vibrators 28. As shown in FIG. 6, in the film formation apparatus of the third embodiment, each of the ultrasonic vibrators 28 is inclined with respect to the reservoir 26. Specifically, perpendicular lines V to the respective vibration surfaces 28a of the ultrasonic vibrators 28 are inclined toward a central portion of the opening 41b of the mist collector 41. Although an inclination angle θ of the ultrasonic vibrators 28 with respect to the inner lateral surface 26c of the reservoir 26 is not particularly limited, it may be 7° for example. Moreover, the film formation apparatus of the third embodiment does not include the water tank 24, unlike the first and second embodiments. However, as in the first and second embodiments, the configuration including the water tank 24 may be adopted. Although FIG. 6 shows that the ultrasonic vibrators 28 overlap with the bottom surface 26a of the reservoir 26, this depiction is merely for easy description and understanding, and the ultrasonic vibrators 28 are actually located below the bottom surface 26a of the reservoir 26. The other configurations of the film formation apparatus of the third embodiment are the same as those of the film formation apparatus of the second embodiment.

The vibration surfaces 28a of the ultrasonic vibrators 28 may be inclined with respect the reservoir 26 as in the present embodiment, in order to efficiently generate the mist 62. In the present embodiment, each of the ultrasonic vibrators 28 is inclined toward the center of the opening 41b of the mist collector 41 so the generated mist 62 easily flows into the mist collector 41.

Figure 7:
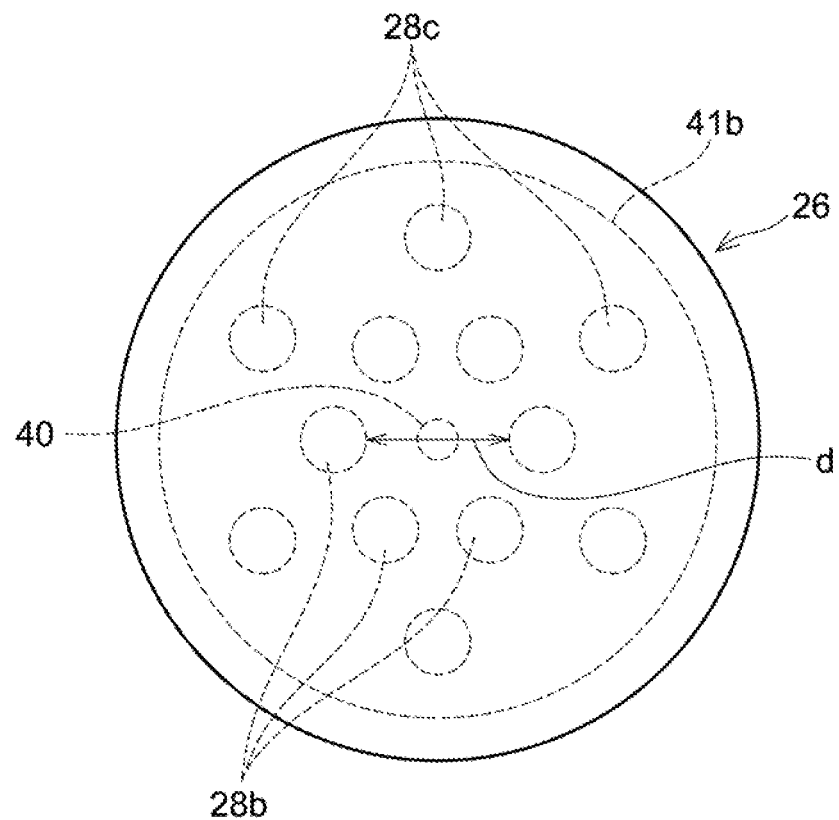
FIG. 7 is a plan view of a mist generator according to a variant.

In the embodiments described above, the plurality of ultrasonic vibrators 28 may be disposed as shown in FIG. 7. Specifically, the plurality of ultrasonic vibrators 28 may include ultrasonic vibrators 28b disposed on an inner side of the reservoir 26 and ultrasonic vibrators 28c disposed on the peripheral side of the reservoir 26. The ultrasonic vibrators 28b on the inner side and the ultrasonic vibrators 28c on the peripheral side may be disposed such that they do not align in a radial direction of the reservoir 26. Moreover, the ultrasonic vibrators 28 may be disposed such that a distance d between any two of the ultrasonic vibrators 28b that are opposite to each other with respect to the center of the reservoir 26 (the position of the mist delivery path 40) is longer than a distance between two adjacent ultrasonic vibrators 28b, a distance between two adjacent ultrasonic vibrators 28e, and the shortest distance between the ultrasonic vibrator 28b and the ultrasonic vibrator 28c. Disposing the plurality of ultrasonic vibrators 28 as described above can suppress interference of the mist 62 respectively generated by the ultrasonic vibrators 28. The mist 62 can thereby be generated stably.

Some of the features characteristic to the technology disclosed herein will be listed below. It should be noted that the respective technical elements are independent of one another, and are useful solely or in combinations.

As an aspect of configuration disclosed hemin, the mist generator may further comprise a carrier gas supply path configured to discharge carrier gas into the reservoir. A discharge port of the carrier gas supply path may be located on a peripheral side of the reservoir relative to the opening, or may be located above the opening.

Such a configuration can suppress the generated mist from being disturbed by a flow of the carrier gas introduced into the reservoir. In other words, changes in concentration of the mist to be supplied from the reservoir to the outside can be suppressed.

In an aspect of configuration disclosed herein, the discharge port of the carrier gas supply path may comprise a plurality of discharge ports.

Such a configuration allows the carrier gas to be introduced into the reservoir frown a plurality of sites. This can suppress unevenness in flow of the carrier gas in the reservoir, and can suppress a non-uniform concentration of the mist.

In an aspect of configuration disclosed herein, the carrier gas supply path may be disposed so as to discharge the carrier gas along an inner lateral surface of the reservoir.

Such a configuration allows the discharged carrier gas to move along the inner lateral surface of the reservoir and to flow from the peripheral side toward the central portion of the reservoir. The generated mist can thereby be guided suitably into the mist collector.

In an aspect of configuration disclosed herein, a relationship of h≥H may be satisfied, where h is a distance from the ultrasonic vibrators to a liquid surface of the solution and H is a distance from the liquid surface to the opening.

The mist becomes stable at a height that is above the liquid surface of the solution by a distance approximately equal to the distance h from the ultrasonic vibrators to the liquid surface. Thus, in the above-described configuration, the opening is disposed below the height at which the mist becomes stable. The generated mist can thereby flew suitably into the mist collector.

In an aspect of configuration disclosed herein, a perpendicular line to a vibration surface of each of the ultrasonic vibrators may be inclined toward a center of the opening.

Such a configuration enables efficient generation of the mist by the inclination of the ultrasonic vibrators. Moreover, the ultrasonic vibrators are inclined toward the center of the opening of the mist collector, so the generated mist can easily flow into the mist collector.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A mist generator comprising:
- a reservoir storing a solution and having a cylindrical shape;
- a plurality of ultrasonic vibrators disposed under the reservoir and configured to apply ultrasonic vibration to the solution stored in the reservoir to generate mist of the solution in the reservoir;
- a mist delivery path configured to deliver the mist from an inside of the reservoir to an outside of the reservoir;
- a mist collector disposed above the solution in the reservoir, wherein an upper end of the mist collector is connected to an upstream end of the mist delivery path, a lower end of the mist collector including an opening, and a width of the mist collector increases from the upper end toward the opening; and
- a plurality of carrier gas supply paths configured to discharge carrier gas into the reservoir, wherein
- the plurality of ultrasonic vibrators is located directly under the opening,
- a discharge port of each of the plurality of carrier gas supply paths is located on a peripheral side of the reservoir that is radially outward from the opening,
- the plurality of carrier gas supply paths extends along a tangential direction of an inner lateral surface of the reservoir, and discharges the carrier gas along the inner lateral surface of the reservoir in a circumferential direction of the reservoir, and
- the carrier gas discharged from the plurality of carrier gas supply paths flows into the mist collector while flowing vortically along the inner lateral surface of the reservoir.

2. The mist generator of claim 1, wherein
- the discharge port of each of the plurality of carrier gas supply paths is located above the opening.

3. The mist generator of claim 1, wherein
- a relationship of h≥H is satisfied, where h is a distance from the ultrasonic vibrators to a liquid surface of the solution and H is a distance from the liquid surface to the opening.

4. The mist generator of claim 1, wherein a perpendicular line to a vibration surface of each ultrasonic vibrator of the plurality of ultrasonic vibrators is inclined toward a center of the opening.

5. A film formation apparatus comprising:
- the mist generator of claim 1; and
- a furnace configured to house a substrate so as to heat the substrate, wherein
- a downstream end of the mist delivery path is connected to the furnace, and
- the film formation apparatus supplies the mist of the solution to a surface of the substrate to grow a film on the surface of the substrate.

6. A method of forming a film on the surface of the substrate using the film formation apparatus of claim 5, wherein
- the plurality of ultrasonic vibrators includes a first ultrasonic vibrator and a second ultrasonic vibrator,
- the method comprises:
- activating the first ultrasonic vibrator; and
- activating the second ultrasonic vibrator after activating the first ultrasonic vibrator.

7. The method of claim 6, further comprising:
- stopping the first ultrasonic vibrator after activating the second ultrasonic vibrator; and
- stopping the second ultrasonic vibrator after stopping the first ultrasonic vibrator.

* * * * *